US00RE48690E

(19) United States
(12) Reissued Patent
Park et al.

(10) Patent Number: US RE48,690 E
(45) Date of Reissued Patent: Aug. 17, 2021

(54) LIGHT UNIT AND A LCD LIQUID CRYSTAL DISPLAY COMPRISING THE LIGHT UNIT

(71) Applicant: LG INNOTEK CO., LTD., Seoul (KR)

(72) Inventors: Kwang Ho Park, Seoul (KR); Woo Young Chang, Seoul (KR); Chul Hong Kim, Seoul (KR); Byoung Eon Lee, Seoul (KR)

(73) Assignee: LG INNOTEK CO., LTD., Seoul (KR)

(21) Appl. No.: 16/440,343

(22) Filed: Jun. 13, 2019

Related U.S. Patent Documents

Reissue of:
(64) Patent No.: 9,678,382
Issued: Jun. 13, 2017
Appl. No.: 14/343,721
PCT Filed: Sep. 9, 2011
PCT No.: PCT/KR2011/006739
§ 371 (c)(1),
(2) Date: Mar. 7, 2014
PCT Pub. No.: WO2013/035909
PCT Pub. Date: Mar. 14, 2013

(51) Int. Cl.
*G02F 1/1335* (2006.01)
*F21V 8/00* (2006.01)
*G02F 1/13357* (2006.01)

(52) U.S. Cl.
CPC ..... *G02F 1/133603* (2013.01); *G02B 6/0021* (2013.01); *G02B 6/0041* (2013.01); *G02B 6/0051* (2013.01); *G02B 6/0055* (2013.01)

(58) Field of Classification Search
CPC ..... G02F 1/1336; G02F 1/133603; G02F 1/133606; G02F 1/133611;
(Continued)

(56) References Cited

U.S. PATENT DOCUMENTS 4,989,933 A * 2/1991 Duguay ..... G02B 5/0242 359/599
5,956,107 A 9/1999 Hashimoto et al.
(Continued)

FOREIGN PATENT DOCUMENTS

JP H05-341131 A 12/1993
JP 2004-311353 A 11/2004
(Continued)

OTHER PUBLICATIONS

European Search Report dated Nov. 19, 2019 in European Application No. 19190305.3.
(Continued)

*Primary Examiner* — James A Menefee
(74) *Attorney, Agent, or Firm* — Saliwanchik, Lloyd & Eisenschenk

(57) ABSTRACT

Provided is a light unit including a plurality of LED light sources formed on a PCB, a resin layer stacked on the PCB to diffuse and guide emitted light forwards, and a diffusion plate having an optical pattern printed thereon to shield light emitted from the LED light sources. The optical pattern is composed of a diffusion pattern implemented as at least one layer, or a combination of the diffusion pattern layer and a light shielding pattern. The light unit forms an optical pattern for shielding or diffusing light on a surface of a light diffusion plate of the back-light unit, and combines a diffusion pattern and a metal pattern to attain uniformity of light and realize a yellow-light shielding effect, thus leading to a reliable light quality.

20 Claims, 5 Drawing Sheets

(58) Field of Classification Search

CPC ..... G02F 1/133615; G02B 6/0001; G02B 6/0055; G02B 6/0051; G02B 6/0021

See application file for complete search history.

(56) References Cited

U.S. PATENT DOCUMENTS

| | | | | |
|---|---|---|---|---|
| 8,355,093 | B2 | 1/2013 | Shin et al. | |
| 8,675,149 | B2 | 3/2014 | Jung et al. | |
| 8,858,025 | B2 * | 10/2014 | Park | F21V 7/22 362/248 |
| 9,303,844 | B2 * | 4/2016 | Kim | F21V 5/008 |
| 9,482,889 | B2 * | 11/2016 | Choe | G02F 1/133603 |
| 9,627,595 | B2 * | 4/2017 | Park | H01L 25/0753 |
| 9,664,844 | B2 * | 5/2017 | Park | F21S 43/195 |
| 9,939,677 | B2 * | 4/2018 | Hur | G02F 1/133605 |
| 9,970,604 | B2 * | 5/2018 | Yang | G02B 6/0016 |
| 2006/0181901 | A1 * | 8/2006 | Sakai | G02B 6/0096 362/613 |
| 2009/0066878 | A1 * | 3/2009 | Ogiro | G02F 1/133611 349/62 |
| 2009/0079908 | A1 | 3/2009 | Miyazaki et al. | |
| 2009/0231264 | A1 | 9/2009 | Hatakeyama et al. | |
| 2010/0046202 | A1 * | 2/2010 | Joo | G02B 5/0215 362/97.1 |
| 2011/0051411 | A1 * | 3/2011 | Kim | G02F 1/133603 362/235 |
| 2011/0051412 | A1 * | 3/2011 | Jeong | G02F 1/133603 362/235 |
| 2011/0205758 | A1 | 8/2011 | Kim et al. | |
| 2011/0228193 | A1 * | 9/2011 | Shin | F21V 11/00 349/61 |
| 2011/0242796 | A1 * | 10/2011 | Yang | C09J 11/02 362/97.1 |
| 2011/0249215 | A1 * | 10/2011 | Jung | G02F 1/133611 349/61 |
| 2011/0261290 | A1 * | 10/2011 | Kim | G02B 6/0021 349/64 |
| 2012/0014092 | A1 * | 1/2012 | Lee | G02B 6/0021 362/97.1 |
| 2012/0250350 | A1 * | 10/2012 | Kim | G02F 1/133606 362/606 |
| 2014/0048779 | A1 * | 2/2014 | Lee | H01L 51/52 257/40 |

FOREIGN PATENT DOCUMENTS

| | | | |
|---|---|---|---|
| JP | 2007-141546 | A | 6/2007 |
| JP | 2008-053069 | A | 3/2008 |
| JP | 2008-268707 | A | 11/2008 |
| JP | 2009-244861 | A | 10/2009 |
| JP | 2010-040236 | A | 2/2010 |
| JP | 4461197 | B1 | 5/2010 |
| KR | 10-2003-0081975 | A | 10/2003 |
| KR | 10-2006-0031518 | A | 4/2006 |
| KR | 10-2007-0109555 | A | 11/2007 |
| KR | 10-2009-0001104 | A | 1/2009 |
| KR | 10-2011-0032476 | A | 3/2011 |
| KR | 10-2011-0068833 | | 6/2011 |
| KR | 10-2011-0104398 | | 9/2011 |
| KR | 10-2011-0104401 | | 9/2011 |
| WO | WO-2011/025174 | A2 | 3/2011 |
| WO | WO-2011/025175 | A2 | 3/2011 |
| WO | WO-2011/033901 | A1 | 3/2011 |
| WO | WO-2011/056026 | A2 | 5/2011 |
| WO | WO-2011/115343 | A1 | 9/2011 |
| WO | WO-2011/129561 | A2 | 10/2011 |

OTHER PUBLICATIONS

Office Action dated May 30, 2011 in Korean Application No. 10-2010-0023518.

Office Action dated Jul. 18, 2011 in Korean Application No. 10-2010-0023520.

Office Action dated Mar. 12, 2014 in Japanese Application No. 2014-529597.

Supplementary European Search Report dated May 27, 2015 in European Application No. 11872142.2.

Office Action dated Jan. 4, 2016 issued in U.S. Appl. No. 14/343,721.

Final Office Action dated Oct. 3, 2016 issued in U.S. Appl. No. 14/343,721.

Notice of Allowance dated Feb. 10, 2017 issued in U.S. Appl. No. 14/343,721.

Office Action dated May 22, 2014 in Taiwanese Application No. 100132837.

Office Action dated Dec. 9, 2014 in Japanese Application No. 2014-529597.

Extended European Search Report dated May 27, 2015 in European Application No. 11872142.2.

International Search Report in International Application No. PCT/KR2011/006739, filed Sep. 9, 2011.

* cited by examiner

LIGHT UNIT AND A LCD LIQUID CRYSTAL DISPLAY COMPRISING THE LIGHT UNIT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application is the U.S. national stage application of International Patent Application No. PCT/KR2011/006739, filed Sep. 9, 2011, the disclosure of which is incorporated herein by reference in its entirety.] *The present application is a reissue application of U.S. patent application Ser. No. 14/343,721, filed Mar. 7, 2014, now U.S. Pat. No. 9,678,382, issued Jun. 13, 2017, which is the U.S. national stage application of International Patent Application No. PCT/KR2011/006739, filed Sep. 9, 2011, the disclosure of each of which is hereby incorporated herein by reference in its entirety.*

TECHNICAL FIELD

The present invention relates to a light unit eliminating a light guide plate and having a diffusion plate on which an optical pattern for increasing light shielding and haze effects is formed.

BACKGROUND ART

In general, a liquid crystal display (LCD) is a device that individually supplies a data signal based on image information to pixels arranged in a matrix array and adjusts optical transmittance of the pixels to form a desired image. Since LCD cannot emit light by itself, a light unit is mounted to a rear of the LCD to produce an image.

Referring to FIG. 1, such a light unit 1 is configured so that a flat light guide plate 30 is placed on a substrate 20 and a plurality of side view LEDs 10 (only one of them is shown) is placed at a side of a light guide plate 30 in an array form.

Light L transmitted from the LED 10 to the light guide plate 30 is reflected upwards by a fine reflection pattern or a reflection sheet 40 formed on a lower surface of the light guide plate 30, exits from the light guide plate 30, and thereafter supplies back light to a LCD panel 50 located above the light guide plate 30.

As shown in the conceptual view of FIG. 2, the light unit may further include a plurality of optical sheets, including a diffusion sheet 31, prism sheets 32 and 33, and a protection sheet 34, between the light guide plate 30 and the LCD panel 50.

Such a light unit functions to uniformly illuminate the LCD, which cannot emit light by itself, from the back thereof to allow a display image to be seen. The light guide plate functions to provide uniform luminance and illumination to the light unit and is a kind of plastic molded lens uniformly delivering light from a light source (LED) to an entire surface of the LCD. Thus, such a light guide plate is basically used as an essential part of the back-light unit. However, the conventional light unit is problematic in that it is difficult to achieve thinness of an entire product because of the thickness of the light guide plate, and an image quality may be deteriorated in the case of a large-area back-light unit.

Further, the light diffusion plate or the diffusion sheet 31 of the conventional light unit for diffusing light has a shielding pattern to prevent light from being concentrated. Such a shielding pattern implements a light shielding effect using Ag. However, the optical pattern using Ag for obtaining the light shielding effect has a drawback in that a portion having the pattern is completely optically shielded, so that it is difficult to attain uniformity of light through an entire portion, and reliability of the light unit emitting white light is lowered because of yellow light emitted from the light source, the LED.

DISCLOSURE OF INVENTION

Technical Problem

An aspect of the present invention is directed to a light unit which forms an optical pattern for shielding or diffusing light on a surface of a light diffusion plate of the back-light unit, and combines a diffusion pattern and a metal pattern to attain uniformity of light and realize a yellow-light shielding effect, thus leading to a reliable light quality.

Another aspect of the present invention is directed to a light unit which eliminates a light guide plate essential for a general light unit and forms a light-source guide structure using a film-type resin layer, thus reducing the number of light sources, achieving thinness of the entire back-light unit, and enhancing the degree of freedom when designing a product.

Solution to Problem

According to an embodiment of the present invention, there is provided a light unit including a plurality of LED light sources formed on a PCB formed by stacking reflection films; a resin layer stacked on the PCB to diffuse and guide emitted light forwards; and a diffusion plate having an optical pattern printed thereon to shield light emitted from the LED light sources. The light unit may further include a surface treatment layer formed to receive the optical pattern between the resin layer and the light diffusion plate.

According to another embodiment of the present invention, the optical pattern may be formed on a surface of the diffusion plate, and may comprise a diffusion pattern implemented as at least one layer, or a combination of the diffusion pattern layer and a light shielding pattern.

Advantageous Effects of Invention

The present invention is advantageous in that an optical pattern is formed on a surface of a light diffusion plate of a light unit to shield or diffuse light, and combines a diffusion pattern and a metal pattern to attain uniformity of light and shield yellow light, thus resulting in a reliable light quality.

Particularly, the present invention is advantageous in that a light guide plate essential for a general light unit is eliminated, and a light-source guide structure is formed using a film-type resin layer, thus reducing the number of light sources, achieving thinness of the back-light unit, and enhancing the degree of freedom when designing a product.

Further, a side view LED is installed in a direct type to remarkably reduce the number of light sources and attain optical characteristics, and a light guide plate is eliminated to allow the light unit to be applied to a flexible display structure, and a resin layer is provided with a reflection film having a reflection pattern and a light diffusion plate having a shielding pattern to achieve stable emission properties.

BRIEF DESCRIPTION OF DRAWINGS

The above and other aspects, features and advantages of certain exemplary embodiments of the present invention will be more apparent from the following description taken in conjunction with the accompanying drawings, in which.

REFERENCE NUMERALS

Figure 1:
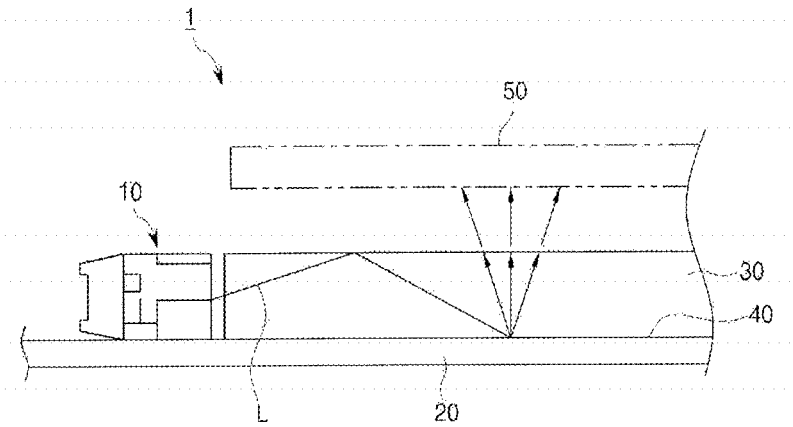
FIG. 1 PRIOR ART
FIGS. 1 and 2 are conceptual views showing a configuration of a conventional back-light unit.
Figure 2:
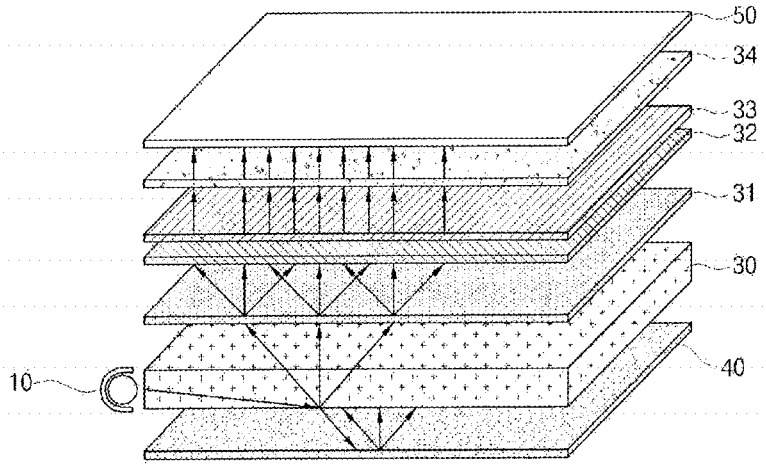

110: PCB
111: LED light source
120: reflection film
130: reflection pattern
140: resin layer
150: diffusion plate
151: optical pattern
151a: diffusion pattern
151b: shielding pattern
152: surface treatment layer
160: prism sheet

BEST MODE FOR CARRYING OUT THE INVENTION

Exemplary embodiments of the present invention will be described below in detail with reference to the accompanying drawings. Wherever possible, the same reference numerals will be used to refer to the same elements throughout the specification, and a duplicated description thereof will be omitted. It will be understood that although the terms "first", "second", etc. are used herein to describe various elements, these elements should not be limited by these terms. These terms are only used to distinguish one element from another element.

The present invention is directed to a back-light unit, which forms a diffusion plate having an optical pattern layer for efficiently shielding or diffusing light, thus enhancing optical efficiency, and eliminates a light guide plate from a conventional light unit and forms a resin layer in place of the light guide plate, thus remarkably reducing an entire thickness of the back-light unit, and can reduce the number of light sources. Particularly, the present invention is directed to a light unit having a surface treatment layer, which is capable of removing an air layer due to a step of an optical pattern when a diffusion plate and a resin layer are coupled to each other.

Mode for the Invention

Figure 3:
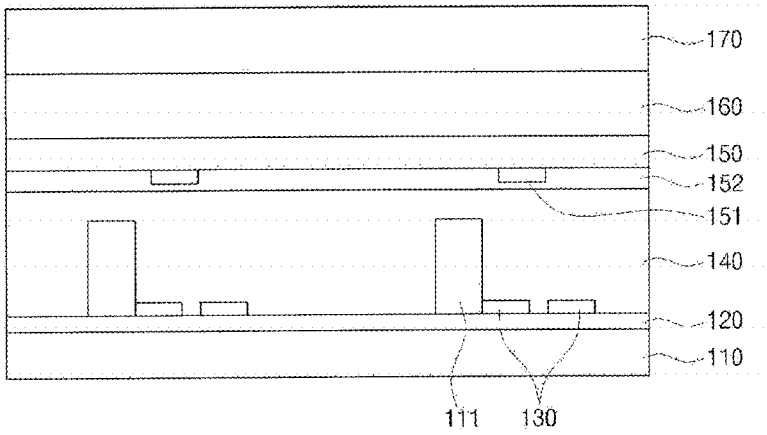
FIGS. 3 and 4 are conceptual views showing important parts of light unit in accordance with the present invention.
Figure 4:
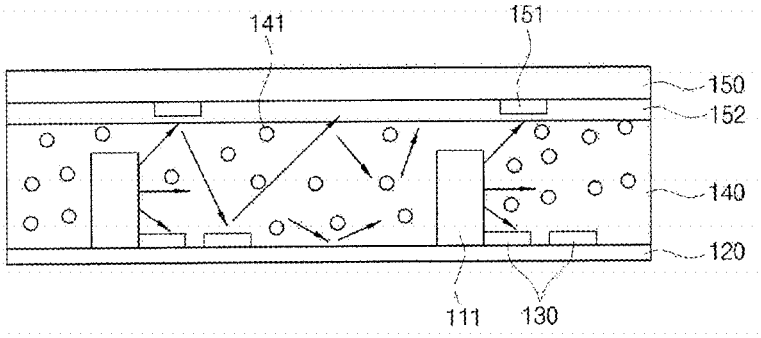

FIGS. 3 and 4 show a configuration of a light unit according to the present invention. The light unit of the present invention includes a plurality of LED light sources 111 that are formed on a PCB 110, and a resin layer 140 that is stacked on the LED light sources 111 to diffuse and guide emitted light forwards. Of course, in this case, a reflection film 120 is stacked on an upper surface of the PCB, a diffusion plate 150 is provided above the resin layer 140, and a prism sheet 160 and a protection sheet 170 are additionally provided above the diffusion plate 150.

Particularly, in the above-mentioned configuration, a surface treatment layer 152 is preferably provided between the resin layer 140 and an optical pattern 151 formed on a surface of the diffusion plate 150 to flatten unevenness of the optical pattern.

Preferably, the surface treatment layer 152 is formed as a flattened layer for covering an entire step of the optical pattern 151 so as to eliminate a difference between a dark space and a bright space due to an air layer caused by the step when the optical pattern 151 of the diffusion plate adheres to the resin layer 140 disposed thereunder. Thus, as shown in the drawings, it is preferable that a height of the surface treatment layer be equal to or higher than that of the optical pattern. It is more preferable that the surface treatment layer 152 he basically made of the same material as the resin layer 140 so as to improve adhesive properties.

As shown in the drawings, at least one LED light source 111 is placed on the PCB 110 to emit light. According to a preferred embodiment of the present invention, a side view LED may be used. That is, it is possible to use a light source that is configured so that light emitted from the LED light source 111 does not travel straight upwards but travels towards a side surface. Further, the LED light source may be disposed in a direct type using the side view LED. Thereby, the entire thickness of the light unit can be remarkably reduced while reducing the number of light sources using the resin layer for diffusing and reflecting light.

The resin layer 140 is stacked to surround the LED light source 111, thus dispersing light emitted laterally from the light source. That is, the resin layer 140 may perform the function of the conventional light guide plate. Any material may be applied to the resin layer, as long as the material is resin capable of diffusing light. The resin layer according to an embodiment of the present invention may comprise resin that uses urethane acrylate oligomer as a main material. For example, a mixture of urethane acrylate oligomer that is synthetic oligomer and polyacryl that is a polymer type may be used. Of course, this mixture may further contain a reactive dilution monomer with a low boiling point, such as isobornyl acrylate (IBOA) and Hydroxylpropyl acrylate (HPA), 2-hydroxyethyl acrylate (2-HEA), and may contain a photo initiator (e.g. 1-hydroxycyclohexyl phenyl-ketone) or antioxidant as an additive.

In this case, as shown in FIG. 3, the resin layer 140 includes beads 141 to increase the diffusion and reflection of light. It is preferable that the beads be 0.01 to 0.3 wt % of the total composition of the resin layer. That is, light emitted laterally from the LED is diffused and reflected by the resin layer 140 and the beads 141 so as to travel upwards. Further, the reflection film 120 and a reflection pattern 130, which will be described below in detail, can promote a reflecting function. The resin layer remarkably reduces a thickness occupied by the conventional light guide plate, thus achieving the thinness of an entire product, and includes a flexible material, thus having universality to allow the light unit to be applied to a flexible display.

More preferably, the reflection film 120 is made of a reflective material to disperse light emitted from the light source, and is provided with the reflection pattern 130 through white printing so as to promote the dispersion of light. The reflection pattern may be printed using reflective ink containing any one of $TiO_2$ and $Al_2O_3$.

The diffusion plate 150 functions to diffuse light that is emitted through the resin layer 140, and preferably has an optical pattern 151 to partially shield light, thus preventing yellow light from being emitted or preventing optical characteristics from being deteriorated when the intensity of light is excessively strong. That is, a shielding pattern may be printed using light shielding ink so as to prevent light from being concentrated.

Further, the optical pattern 151 formed a lower surface of the diffusion plate is treated by the surface treatment layer 152 to prevent a dark space from occurring due to the air layer when the optical pattern is printed and to improve adhesive strength between the diffusion plate 150 and the resin layer 140. Particularly, to this end, the surface treatment layer 152 may be made of the same material as the resin layer.

Figure 5:
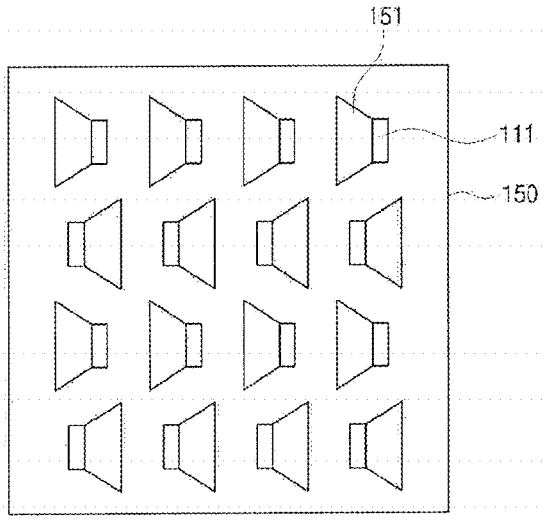
FIG. 5 is a plan view showing an arrangement of LEDs and optical patterns of a diffusion plate in accordance with the present invention.

FIG. 5 is a conceptual view showing a configuration wherein the diffusion plate 150 covers an upper portion of each LED light source 111, and particularly shows a positional relation between the light source and the optical is pattern 151. The optical pattern 151 may be basically printed on the lower or upper surface of the diffusion plate 150. More preferably, the optical pattern is located in a direction (front direction) where light is emitted from the LED light source 111 placed under the diffusion plate. That is, the optical pattern may be formed on the diffusion plate at a position corresponding to a light emitting direction or a vertical upper surface of the LED light source.

The optical pattern 151 according to the present invention may be formed on the lower surface of the diffusion plate in a light emitting direction by overlapping printing a diffusion pattern and a shielding pattern as a single layer or a multiple layer. Here, the diffusion pattern is formed using light shielding ink that contains at least one substance selected from a group consisting of $TiO_2$, $CaCO_3$, $BaSO_4$, $Al_2O_3$, and Silicon. The shielding pattern is formed using light shielding ink that contains Al or a mixture of Al and $TiO_2$.

Figure 6:
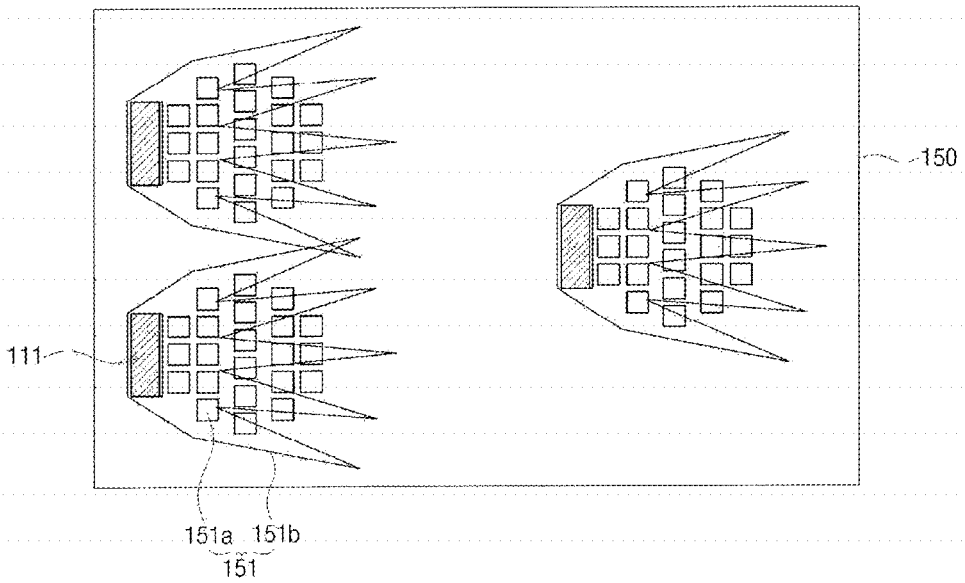
FIG. 6 is a view illustrating optical patterns in accordance with the present invention.

FIG. 6 illustrates an example of forming an optical pattern according to the present invention.

The example of forming the optical pattern will be described with reference to the drawing. The optical pattern 151 may be implemented on the lower surface of the diffusion plate in the light emitting direction by overlapping printing a diffusion pattern 151a and a shielding pattern 151b. The diffusion pattern 151a is formed using light shielding ink containing at least one substance selected from a group consisting of $TiO_2$, $CaCO_3$, $BaSO_4$, $Al_2O_3$, and Silicon. The shielding pattern 151b is formed using light shielding ink containing Al or a mixture of Al and $TiO_2$. That is, after the diffusion pattern 151a is formed on the surface of the diffusion plate by white printing, the shielding pattern 151b is formed on the diffusion pattern 151a. Alternatively, such a double structure may be formed in a reverse order. It is obvious that a design having such a pattern may be variously changed in consideration of efficiency and intensity of light and a light shielding ratio.

Further, as a subsequent stacked structure, the shielding pattern 151b that is a metal pattern may be formed as an intermediate layer, and the diffusion patterns 151a may be formed, respectively, on upper and lower portions of the shielding pattern 151b to provide a triple structure. Such a triple structure may be implemented using the above substances. As a preferred embodiment, one of the diffusion patterns may be formed using $TiO_2$ having a high refractive index, the other diffusion pattern may be formed using both $CaCO_3$ and $TiO_2$ having good light stability and color sense, and the shielding pattern may be formed using Al having a high shielding ability, thus providing a triple structure. Such a structure can provide efficiency and uniformity of light. Particularly, $CaCO_3$ reduces the exposure of yellow light to finally implement white light, thus achieving more stable light efficiency. In addition to $CaCO_3$, it is possible to use inorganic material, such as $BaSO_4$, $Al_2O_3$, or Silicon bead, having a large particle size and a similar structure. The optical pattern is preferably formed so that a pattern density is reduced as a distance from the emitting direction of the LED light source increases, which is advantageous in terms of light efficiency.

A process of forming the optical pattern will be described below with reference to FIGS. 7a to 7c.

As shown in the drawings, the optical pattern according to the present invention may be printed on the upper or lower surface of the diffusion plate 150. As shown in FIG. 7a, the optical pattern may be implemented by single tone printing to form one pattern layer (first pattern; 151a). As shown in FIG. 7b, the optical pattern may be implemented by overlapping printing a second pattern 151b on the first pattern 151a. Further, as shown in FIG. 7c, the optical pattern may be implemented as a triple structure by printing the first and second patterns and subsequently overlapping printing a third pattern on the printed first and second patterns. The overlapping printing structure means a structure obtained by forming one pattern and printing another pattern on the previously formed pattern.

Figure 7:
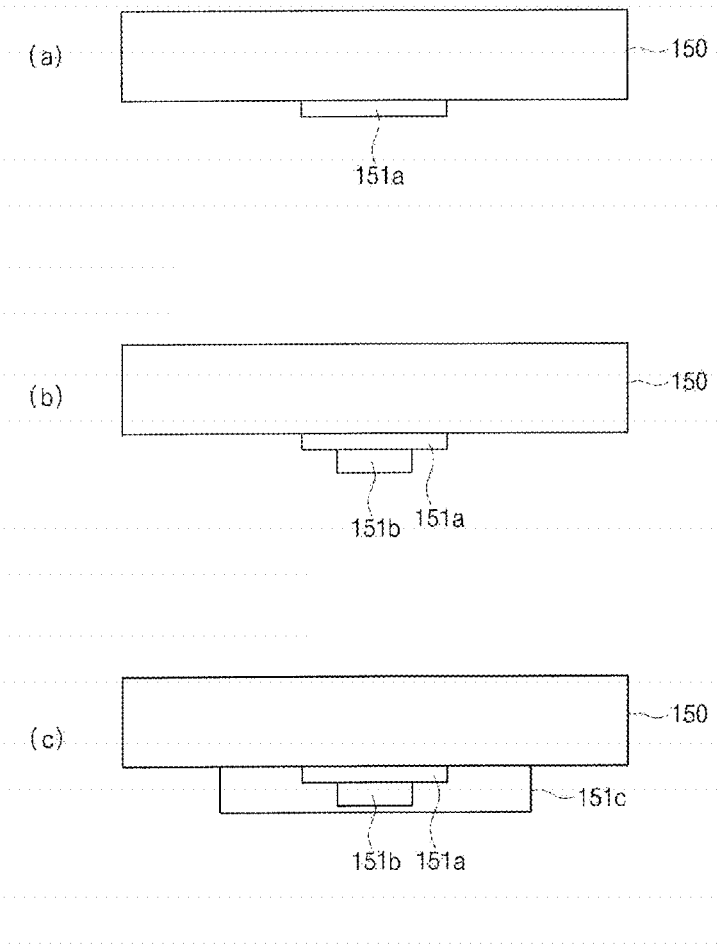
FIGS. 7a to 7c are views illustrating an embodiment of manufacturing optical patterns in accordance with the present invention.

As shown in FIG. 7a, when the optical pattern is formal on a surface of the diffusion plate 150 by single tone printing, the printing is preferably performed using light shielding ink containing $TiO_2$ to achieve excellent light shielding effect and diffusion effect. In this case, the light shielding ink may use a resin substance, for example, a mixture of resin such as acryl polyol, hydrocarbon- or ester-based solvent, and inorganic pigment such as $TiO_2$. Particularly, an additive such as a silicone-type wetting and dispersing agent or a defoamer/levelling agent may be added to the above substance.

Further, the inorganic pigment may use $TiO_2$ or $TiO_2$ and one or more substances selected from a group consisting of $CaCO_3$, $BaSO_4$, $Al_2O_3$ and Silicon.

The inorganic pigment may use a particle size of 500 to 550 nm. According to one experimental example, the light shielding ink may contain 20 to 25% acryl polyol resin, 20 to 29% solvent, 50 to 55% inorganic pigment, and 1 to 2% additive.

Next, at the step shown in FIG. 7b, another optical pattern according to the present invention may be formed in a double structure by overlapping printing the diffusion pattern (first pattern) that achieves light diffusing or shielding effect and the shielding pattern (second pattern) that achieves light shielding effect. That is, after the first pattern is printed as shown in FIG. 7a, the second pattern may be formed on the first pattern by the light shielding ink containing a metal-based substance. The second pattern may be printed using light shielding ink containing Al or a mixture of Al and $TiO_2$. Of course, in this case, the first and second patterns may be stacked in a different order.

The second pattern is characterized in that it contains metal-based pigment. For example, light shielding ink containing the metal-based pigment may use a substance produced by mixing resin such as acryl polyol, hydrocarbon- or ester-based solvent, metal-based pigment, and an additive such as a wetting and dispersing agent, a defoamer or a levelling agent. The substance may have the following composition, for example, 36 to 40% acryl polyol resin, 33 to 40% solvent, 20 to 25% inorganic pigment, and 1 to 2% additive. Further, the solvent may be produced by mixing 10 to 15% hydrocarbon-based solvent that has a low boiling point and 23 to 25% ester-based solvent. The second pattern that is the metal pattern can basically achieve light shielding effect.

In the case of forming the stacked structure having two patterns, the diffusion pattern and the shielding pattern as in this embodiment, the first pattern, namely, the diffusion pattern may he formed using light shielding ink containing one or more substances selected from a group consisting of $CaCO_3$, $BaSO_4$, $Al_2O_3$ and Silicon.

Further, at the step shown in FIG. 7c, the optical pattern according to the present invention may be formed in a triple structure by overlapping printing.

That is, the intermediate layer of the optical pattern may be implemented as the shielding pattern layer having the metal pattern, and the diffusion patterns may he formed on upper and lower surfaces of the intermediate layer.

As described above, the shielding pattern (second pattern) that is the metal pattern is formed using light shielding ink containing Al or a mixture of Al and $TiO_2$, and the diffusion pattern described at the step of FIG. 7a or 7b is formed on the upper or lower portion of the shielding pattern.

For example, the first and third patterns that are the outermost pattern comprises diffusion patterns, and are formed as the light shielding ink layer containing $TiO_2$ or one or more substances selected from a group consisting of $CaCO_3$, $BaSO_4$, $Al_2O_3$, and Silicon, or formed as the light shielding ink layer containing a mixture of TiO2 and any one of $CaCO_3$, $BaSO_4$, $Al_2O_3$, and Silicon. Further, each of the patterns (first, second, and third patterns) forming the optical pattern may have a thickness from 4 to 100 μm.

Figure 8:
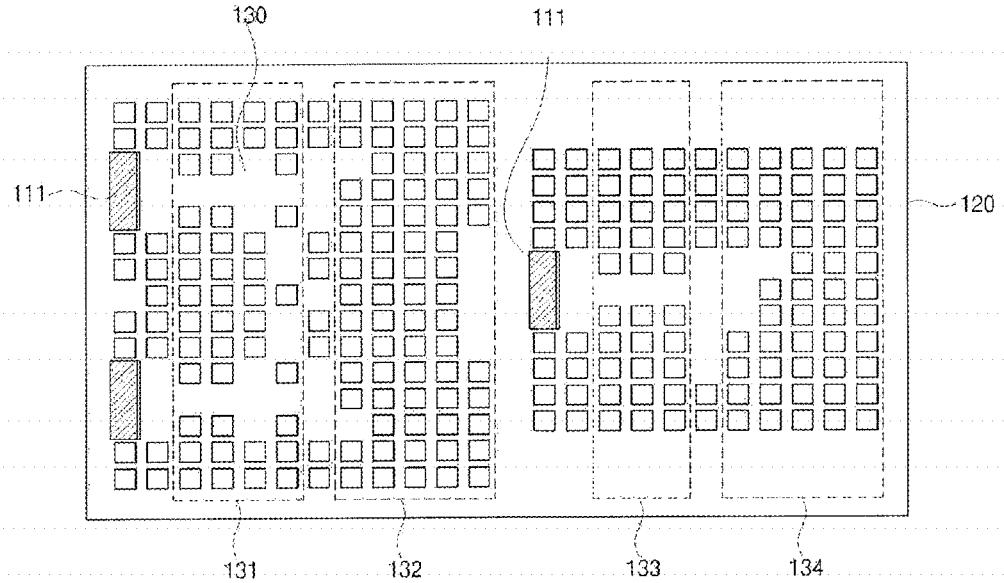
FIG. 8 is a view illustrating a reflection pattern in accordance with the present invention.

FIG. 8 is a plan view showing a configuration of the reflection film and the reflection pattern in accordance with the present invention.

Referring to FIG. 8, the reflection film 120 according to the present invention is stacked on the PCB, and the LED light source 111 protrudes to an outside through a hole formed on the reflection film 120. When the LED light source is implemented as the side view LED structure, the number of light sources may he considerably reduced as described above. In order to cope with the reduction, the reflection pattern 130 is preferably formed to considerably improve reflectivity of light.

As in the example shown in the drawing, the reflection pattern is preferably formed in a light emitting direction of the LED light source. Particularly, the optical pattern is formed so that a pattern density is increased as a distance from the emitting direction of the LED light source increases. In a detailed description, a second area 132 distant from the light emitting direction has a higher pattern density in comparison with a first area 131 near to the light emitting direction so as to increase reflectivity. Of course, the pattern may be implemented in various shapes according to design intention. Further, the reflection pattern may be formed by a printing method using reflective ink containing any one of $TiO_2$ and $Al_2O_3$.

Figure 9:
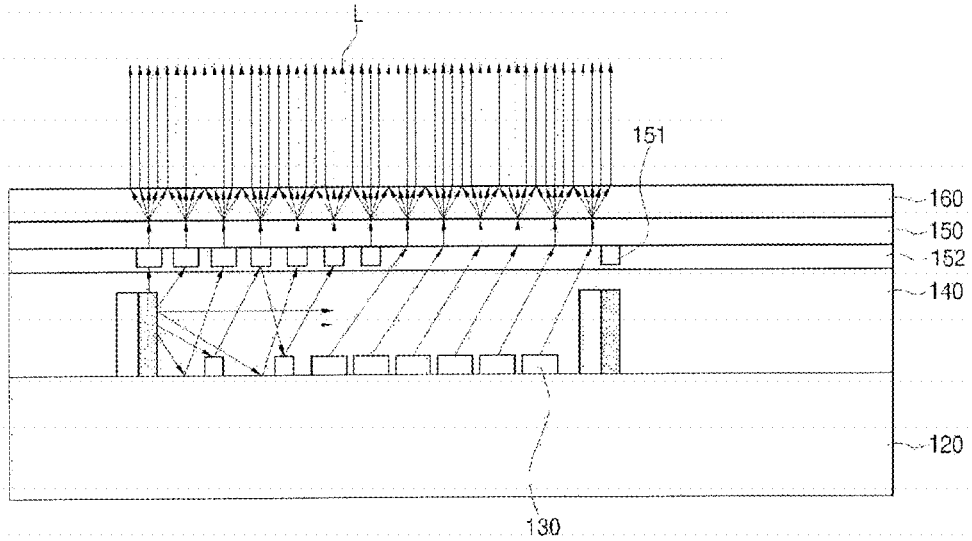
FIG. 9 is a view illustrating a configuration and operation of the light unit in accordance with the present invention.

FIG. 9 is a view showing an operation of the light unit according to the present invention. The operation of the light unit will be described with reference to FIG. 3 illustrating the basic configuration and FIG. 9 illustrating the operation.

As shown in the drawings, the light unit according to the present invention is operated so that light is laterally emitted from the side view LED 111 and the emitted light is reflected and diffused by the resin layer 140 formed in place of the conventional light guide plate. Here, the reflection efficiency of the light is further enhanced by the reflection film 120 and the reflection pattern 130 to allow light to be guided forwards.

The light passing through the resin layer 140 as such is diffused or shielded by the optical pattern 151 formed on the diffusion plate 150. The light L purified as such passes through an optical sheet such as the prism sheet 160, and is incident into an LCD panel as white light. More preferably, the surface treatment layer 152 is provided on the optical pattern 151 to improve adhesiveness between the optical pattern 151 and the resin layer 140 and eliminate the air layer during adhesion, thus eliminating a dark space and improving reliability.

As such, the light unit according to the present invention eliminates the light guide plate, applies the side view LED to a light supply source, and guides light by diffusing and reflecting light through the resin layer, thus achieving thinness and reducing the number of light sources. Further, reduction in luminance and uniformity due to reduction of the number of light sources may be compensated for by the optical pattern such as the reflection pattern, the shielding pattern, or the diffusion pattern, thus realizing a uniform image quality.

Further, a step of the optical pattern occurring when the resin layer is attached to the diffusion plate may reduce adhesive strength and form the air layer, thus producing a dark space. In this case, in order to eliminate the dark space, the surface treatment layer is added. Thereby, a reliable light unit is obtained, which can be applied to an LCD.

While the invention has been shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

The invention claimed is:

1. A light unit, comprising:

a printed circuit board (PCB) which extends in a horizontal direction;

a plurality of LED light sources formed on the PCB;

a resin layer on the PCB and surrounding the LED light sources, the resin layer being configured to diffuse and guide light emitted from the LED light sources;

a diffusion plate on the resin layer; *and* an optical pattern disposed between the diffusion plate and the resin layer,

*wherein the optical pattern is disposed on a lower surface of the diffusion plate and comprises a first pattern on a lower surface of the diffusion plate, a second pattern on a lower surface of the first pattern, and a third pattern on a lower surface of the second pattern,*

[wherein the first pattern is a diffusion pattern, wherein the second pattern is a shielding pattern,]

wherein [the shielding pattern] *at least one of the first pattern, the second pattern, and the third pattern* is configured to shield light emitted from the LED light sources, [and wherein the optical pattern is implemented by overlapping printing the shielding pattern onto the diffusion pattern in a vertical direction]

*wherein a vertical direction is perpendicular to the lower surface of the diffusion plate,*

*wherein an imaginary plane, taken in the vertical direction and including an outer lateral surface of the second pattern, also includes a portion of the first pattern and a portion of the third pattern,*

*wherein an area of the first pattern is larger than an area of the second pattern,*

*wherein the optical pattern includes a first region, a second region, and a third region from the imaginary plane toward a light emitting direction of each of the LED light sources,*

*wherein the first region is closest to the imaginary plane, the third region is farthest from the imaginary plane, and the second region is disposed between the first region and the third region, and*

*wherein the first region is formed of three layers, the second region is formed of two layers, and the third region is formed of one layer in the optical pattern.*

2. The light unit of claim 1, wherein the optical pattern is [disposed on a] *in direct physical contact with the lower* surface of the diffusion plate.

[3. The light unit of claim 1, wherein the diffusion pattern comprises at least one substance selected from the group consisting of $TiO_2$, $CaCO_3$, $BaSO_4$, $Al_2O_3$, and silicon.]

4. The light unit of claim 1, wherein the second pattern is [disposed on a portion of] *in direct physical contact with* the first pattern, [and]

wherein the first pattern is [disposed on] *in direct physical contact with the lower surface of* the diffusion plate.

5. The light unit of claim 1, wherein the [a] second pattern is [formed by overlapping printing on an upper or lower portion of] *in direct physical contact with* the first pattern, [thereby shielding or reflecting the emitted light; and]

wherein the [optical pattern further comprises a] third pattern [comprising a diffusion] *is in direct physical contact with the second* pattern, and wherein the [third] *first* pattern is [disposed between the first pattern and the second pattern] *in direct physical contact with the lower surface of the diffusion plate.*

[6. The light unit of claim 1, wherein the diffusion pattern comprises a substance containing $TiO_2$ or a substance containing $TiO_2$ and $CaCO_3$.]

7. The light unit of claim 1, wherein the first pattern has a thickness *in a range of* from 4μm to 100 μm.

8. The light unit of claim 1, wherein the [shielding] *optical* pattern comprises light shielding ink containing Al or a mixture of Al and $TiO_2$.

9. The light unit of claim 1, wherein *at least one of* the first [or ] *pattern and the* second pattern [further] comprises beads.

10. The light unit of claim 1, wherein the second pattern has a thickness *in a range of* from 4 μm to 100 μm.

[11. The light unit of claim 5, wherein the third pattern comprises a substance containing $TiO_2$ or a substance containing $TiO_2$ and $CaCO_3$.]

12. The light unit of [claim 5] *claim 1*, wherein the third pattern has a thickness *in a range of* from 4 μm to 100 μm.

13. The light unit of claim 1, [further] comprising a surface treatment layer [formed] *disposed* between the resin layer and the diffusion plate and configured to receive the optical pattern, wherein a thickness of the surface treatment layer is equal to or greater than a thickness of the optical pattern.

[14. The light unit of claim 13, wherein the surface treatment layer comprises the same material as the resin layer.]

15. The light unit of claim 1, [further] comprising:

a reflection film on the PCB and having at least one reflection pattern formed thereon.

[16. The light unit of claim 15, wherein the reflection pattern comprises reflective ink containing $TiO_2$ or $Al_2O_3$.]

17. The light unit of claim 1, wherein the resin layer [further] comprises beads.

[18. A liquid crystal display comprising a light unit according to claim 1.]

19. The light unit of claim 13, wherein the optical pattern is buried in the surface treatment layer.

*20. The light unit of claim 1, wherein the optical pattern is spaced apart from the resin layer.*

*21. The light unit of claim 20, comprising a surface treatment layer disposed between the resin layer and the diffusion plate and configured to receive the optical pattern,*

*wherein a thickness of the surface treatment layer is equal to or greater than a thickness of the optical pattern, and*

*wherein the optical pattern is buried in the surface treatment layer.*

*22. The light unit of claim 1, wherein each of the LED light sources comprises a front surface from which light is emitted and a rear surface opposite to the front surface.*

*23. The light unit of claim 22, wherein at least one of the first pattern, the second pattern, and the third pattern is disposed so as not to overlap in the vertical direction with the rear surface of each of the LED light sources.*

*24. The light unit of claim 22, wherein the area of the first pattern, the area of the second pattern, and an area of the third pattern are all different from each other, and*

*wherein the second pattern is disposed so as not to overlap in the vertical direction with the rear surface of each of the LED light sources.*

*25. The light unit of claim 1, wherein an area of the lower surface of the first pattern is larger than an area of the lower surface of the second pattern,*

*wherein an entire upper surface of the second pattern is disposed within a region of the lower surface of the first pattern,*

*wherein an entire lower surface of the second pattern is positioned lower than the entire lower surface of the first pattern, and*

*wherein an entire lower surface of the third pattern is positioned lower than the entire lower surface of the second pattern.*

*26. The light unit of claim 25, wherein the first pattern, the second pattern, and the third pattern of the optical pattern are formed of a material that is non-metallic, inorganic, or both.*

* * * * *